United States Patent
Li et al.

(10) Patent No.: US 10,147,614 B1
(45) Date of Patent: Dec. 4, 2018

(54) OXIDE SEMICONDUCTOR TRANSISTOR AND METHOD OF MANUFACTURING THE SAME

(71) Applicant: UNITED MICROELECTRONICS CORP., Hsin-Chu (TW)

(72) Inventors: Xiang Li, Singapore (SG); Shao-Hui Wu, Singapore (SG); Hsiao Yu Chia, Singapore (SG); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/865,162

(22) Filed: Jan. 8, 2018

(51) Int. Cl.
| | |
|---|---|
| *H01L 21/441* | (2006.01) |
| *H01L 21/304* | (2006.01) |
| *H01L 21/768* | (2006.01) |
| *H01L 29/66* | (2006.01) |
| *H01L 29/24* | (2006.01) |
| *H01L 29/78* | (2006.01) |
| *H01L 23/00* | (2006.01) |
| *H01L 29/786* | (2006.01) |

(52) U.S. Cl.
CPC .......... *H01L 21/441* (2013.01); *H01L 21/304* (2013.01); *H01L 21/76877* (2013.01); *H01L 24/83* (2013.01); *H01L 29/24* (2013.01); *H01L 29/66969* (2013.01); *H01L 29/7831* (2013.01); *H01L 21/76897* (2013.01); *H01L 29/7869* (2013.01); *H01L 29/78666* (2013.01); *H01L 29/78675* (2013.01)

(58) Field of Classification Search
CPC ............. H01L 21/441; H01L 21/76877; H01L 21/304; H01L 21/76897; H01L 29/7869; H01L 29/78666; H01L 29/78675; H01L 29/7831
See application file for complete search history.

(56) References Cited

U.S. PATENT DOCUMENTS

| | | | |
|---|---|---|---|
| 8,101,978 B2 | 1/2012 | Dai | |
| 9,318,317 B2 | 4/2016 | Okazaki | |
| 9,431,441 B1 * | 8/2016 | Zhou | H01L 27/14612 |
| 9,564,217 B1 * | 2/2017 | Zhou | G11C 14/0009 |
| 9,960,190 B2 * | 5/2018 | Yamazaki | H01L 27/1225 |
| 2013/0105868 A1 * | 5/2013 | Kalnitsky | G01N 27/414 |
| | | | 257/288 |
| 2013/0134418 A1 * | 5/2013 | Hayashi | H01L 21/28282 |
| | | | 257/43 |
| 2013/0200438 A1 * | 8/2013 | Liu | G01N 27/414 |
| | | | 257/253 |
| 2015/0255490 A1 * | 9/2015 | Miyairi | H01L 27/1207 |
| | | | 257/43 |
| 2015/0263007 A1 * | 9/2015 | Yamazaki | H01L 27/1255 |
| | | | 257/43 |
| 2017/0227533 A1 * | 8/2017 | Lin | H01L 51/0512 |

* cited by examiner

*Primary Examiner* — Mohsen Ahmadi
(74) *Attorney, Agent, or Firm* — Winston Hsu (57) ABSTRACT

A method of manufacturing an oxide semiconductor transistor is provided in the present invention, which includes the step of providing an oxide semiconductor transistor on the front side of a substrate, attaching a wafer on the front side of the substrate, forming a contact hole extending from the back side of the substrate to the oxide semiconductor layer of the oxide semiconductor transistor, and filling the contact hole with metal material to form a back gate of the oxide semiconductor transistor.

11 Claims, 8 Drawing Sheets

OXIDE SEMICONDUCTOR TRANSISTOR AND METHOD OF MANUFACTURING THE SAME

BACKGROUND OF THE INVENTION

1. Field of the Invention

The present invention generally relates to a method of manufacturing an oxide semiconductor transistor, and more particularly, to a method of manufacturing an oxide semiconductor transistor using a back side process.

2. Description of the Prior Art

In modern society, the micro-processor systems comprising integrated circuits (IC) are ubiquitous devices, being utilized in diverse fields such as automatic control electronics, mobile communication devices and personal computers. With the development of technology and the increase of original applications for electronic products, the IC devices are becoming smaller, more delicate and more diversified.

Attention has been focused on a technique for the formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and within which, an oxide semiconductor containing indium (In), gallium (Ga), and zinc (Zn) has been attracting attention. These kinds of material are essentially semiconductor materials, and it is desired for researchers to develop a semiconductor device by using their semiconductor material properties, such as an oxide semiconductor field effect transistor (OSFET).

A variety of semiconductor devices has been fabricated using a CMOS process for a hybrid of an OS transistor and a Si transistor. An OS transistor can be stacked over a Si transistor. In addition, an OS transistor can include a top gate and a back gate. Extreme low leakage current in the device can be achieved by the back gate with minus voltage employed.

However, the performance and reliability of the OSFET may be severely degraded due to the uneven, rough interface between the back gate and the back gate dielectric caused in the manufacturing process. Therefore, it is urgent for researchers to figure out the new process for solving this problem.

SUMMARY OF THE INVENTION

The following paragraphs present a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The concept of the present invention is to solve the back gate unevenness problem by combining the back gate contact process performed from the back side of wafer into the OSFET manufacturing process. In this way, the back gate will be formed after the formation of OSFET so that the uneven interface issue would not occur since no chemical mechanical polishing (CMP) is performed to the interface.

In one aspect of the embodiments, there is provided a method of manufacturing an oxide semiconductor transistor. The method includes the steps of providing an oxide semiconductor transistor on the front side of a substrate, wherein the oxide semiconductor transistor includes an oxide semiconductor layer on the substrate, a source and a drain on the oxide semiconductor layer, a top gate oxide layer on the oxide semiconductor layer between the source and the drain, a top gate on the top gate oxide layer, and a dielectric layer on the top gate, the source and the drain, forming a bonding layer on the dielectric layer, attaching a wafer on the bonding layer, forming a contact hole extending from the backside of the substrate to the oxide semiconductor layer, and filling the contact hole with metal material to form a back gate of the oxide semiconductor transistor.

In another aspect of the embodiments, there is provided an oxide semiconductor transistor. The transistor includes the elements of a substrate, a back gate extending from the back side of the substrate, an oxide semiconductor layer on the back gate and the front side of the substrate, wherein the surface of the back gate is flush with the bottom surface of the oxide semiconductor layer, a source and a drain on the oxide semiconductor layer, a top gate oxide layer on the oxide semiconductor layer between the source and drain, a top gate on the top gate oxide layer, and a dielectric layer on the top gate, the source and said drain.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The terms "wafer" or "substrate" used herein includes any structure having an exposed surface onto which a layer is deposited according to the present invention, for example, to form the integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by abase semiconductor or insulator, as well as other semiconductor structures well known to one skilled in the art.

Figure 1:
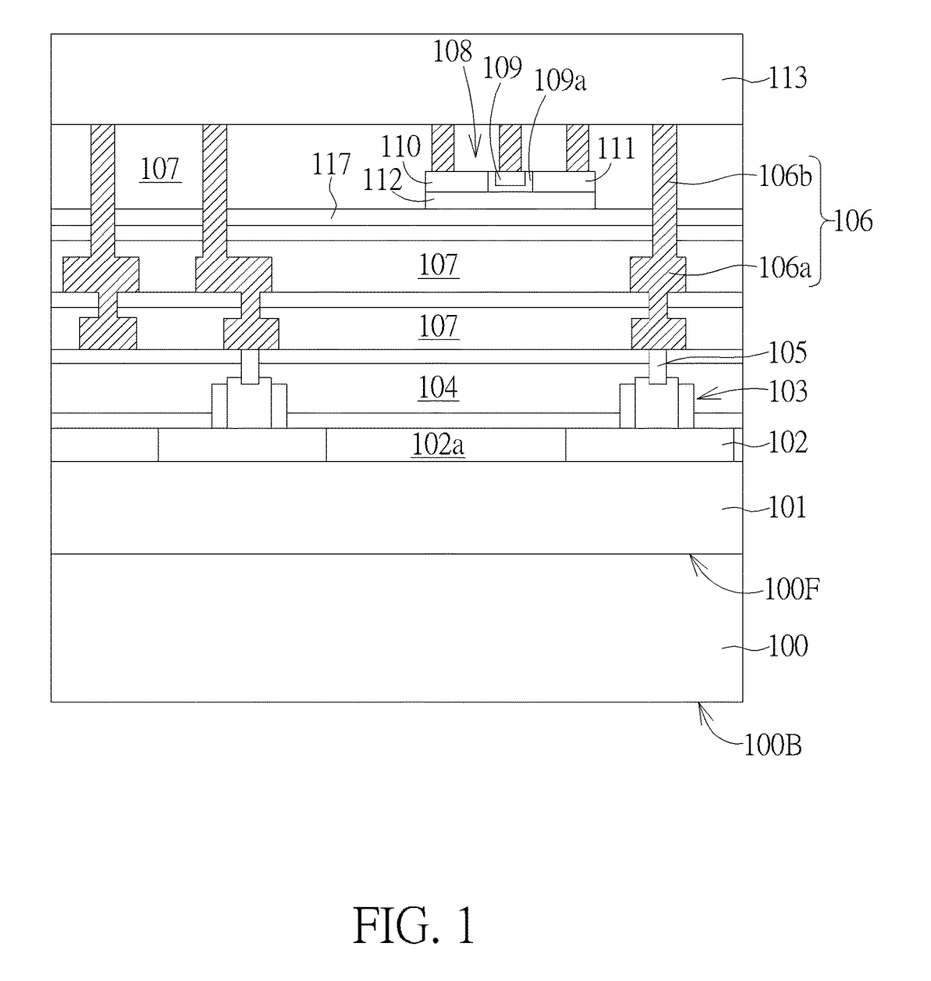
FIGS. 1-4 are cross-sectional views illustrating a manufacturing process flow in accordance with one embodiment of the present invention.

FIG. 1 is a schematic, cross-sectional diagram showing a semiconductor device having integrated logic gates, metal wirings and oxide-semiconductor field effect transistor (OSFET) according to one preferred embodiment of the invention. As shown in FIG. 1, the semiconductor device includes a silicon substrate 100. The substrate 100 includes a front side 100F and a back side 100B opposite to the front side 100F. A thick bottom oxide layer 101 is formed on the front side 100F of the substrate 100. Several silicon-on-insulator (SOI) layers 102 are individually formed on the bottom oxide layer 101, wherein shallow trench isolations (STI) 102a are isolated therebetween. Each SOI layer 102 is provided with a poly gate 103 formed thereon covered by the interlayer dielectric (ILD) 104 and electrically connected with a contact plug 105. The SOI layers 102, the poly gates 103, the ILD layer 104, and the contact plugs 105 may be fabricated in and/or on the substrate 100 by front-end-of-line (FEOL) process, therefore those details are omitted in the interest of brevity.

Please still refer to FIG. 1. Interconnection structures 106 are formed on the front side 100F of the substrate 100 after the FEOL process. The interconnection structure 106 formed after the FEOL process includes a plurality of dielectric layers 107 such as inter-metal dielectric (IMD) layers and a plurality of metal layers 106a and plugs 106b formed therein. The dielectric layers 107 include, but not limited to, silicon oxide. The metal layers 106a and the plugs 106b include, but are not limited to, aluminum (Al) or copper (Cu). It is well-known to those skilled in the art that the interconnection structure 106 is formed by steps of forming one dielectric layer 107, forming recesses (not shown) in the dielectric layer 107, and filling up the recesses with metal material such as Al or Cu to form the metal layers 106a/plugs 106b. These abovementioned steps can be repeated any number of times to form the stacked structure of the interconnection structure 106.

Please still refer to FIG. 1. More important, the semiconductor device provided by the preferred embodiment includes one OSFET devices 108 formed on the front side 100F of the substrate 100. Particularly, the OSFET device 108 is formed in or on the interconnection structure 106. The OSFET device 108 includes a top gate 109, a source 110 and a drain 111 at both sides of the top gate 109, an oxide semiconductor layer 112 under the top gate 109, the source 110 and drain 111. A top gate dielectric layer 109a is formed between the top gate 109 and the oxide semiconductor layer 112. The oxide semiconductor layer 112 may be a multilayer structure and may include the materials of, but not limited to, indium oxide, tin oxide, zinc oxide, two-component metal oxide such as In—Zn-based oxide, Sn—Zn-based oxide, Al—Zn-based oxide, Zn—Mg-based oxide, Sn—Mg-based oxide, In—Mg-based oxide, or In—Ga-based oxide, three-component metal oxide such as In—Ga—Zn-based oxide (IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide, and four-component metal oxide such as In—Sn—Ga—Zn-based oxide, In—Hf—Ga—Zn-based oxide, In—Al—Ga—Zn-based oxide, In—Sn—Hf—Zn-based oxide, or In—Hf—Al—Zn-based oxide. Furthermore, the oxide semiconductor layer 112 can include a c-axis aligned crystalline oxide semiconductor (CAAC-OS) material. In addition, the oxide semiconductor layer 112 is formed on a gate insulating layer 117, such as a silicon oxide (SiO$_X$) layer, a silicon nitride (SiN$_X$) layer, or a high-k dielectric layer (AlO, HfO$_X$, etc).

According to the preferred embodiment, the OSFET device 108 is device of double gate type. That is, a back gate will be provided under the OSFET device 108 to reduce leakage current. In conventional process, the back gate of the OSFET structure is formed before the elements of the oxide semiconductor layer 112, the top gate 109, the source 110 and drain 111. A chemical mechanical polishing (CMP) is required to remove the unnecessary portion of the back gate outside the surface before depositing the gate oxide layer and the oxide semiconductor layer. However, since the material of back gate is usually hard metal like tungsten (W), the W-based back gate would have quite different material removal rate (MRR) from the surrounding oxide-based layer in the CMP process. The result of MMR difference in this process is that the back gate would slightly protrude from the surface predetermined to form the OSFET 108 and cause an uneven surface before the formation of oxide semiconductor layer 112 and the top gate 109. The uneven surface would severely impact the performance and the reliability of OSFET. Therefore, one of the purposes of the present invention to figure out a method for solving this surface unevenness problem.

Please refer again to FIG. 1. The approach of the present invention for solving this problem is to combine the OSFET manufacturing process with the process performed from the back side of wafer. In the concept of the present invention, there will be other processes to be performed on the back side of the wafer to form other devices, such as image sensor pixels. By combining this process with the current OSFET process, the back gate of the OSFET can be formed from the back side of the wafer, so that there will be no protruding back gate and surface unevenness issues. To achieve this kind of process combination, a bonding layer 113, such as a tetraethoxysilane (TEOS) layer, is first formed on the outermost front surface of the substrate to serve as a bonding layer in later process.

Figure 2:
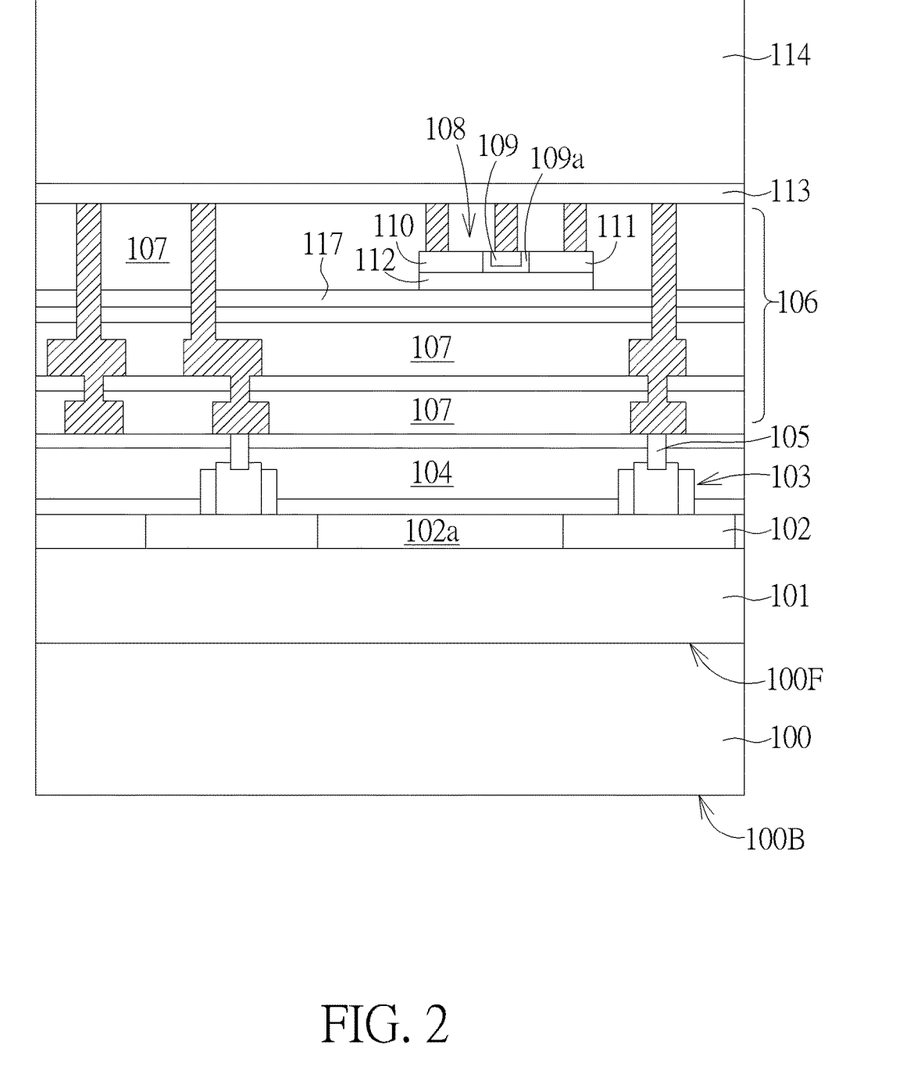

Please refer to FIG. 2. After the bonding layer 113 is formed, the bonding layer 113 is thinned to a predetermined thickness by polishing process. Subsequently, a carrier 114, such as Si-based wafer, is attached on the bonding layer 113 by an aligned fusion bonding process. The bonding process is based on chemical bonds between two surfaces of Si-based carrier 114 and oxide-based bonding layer 113. The stable and hermetic direct bonds may be achieved at a temperature below 450° C. The attached carrier 114 will serve as a substrate during the back side processes.

Figure 3:
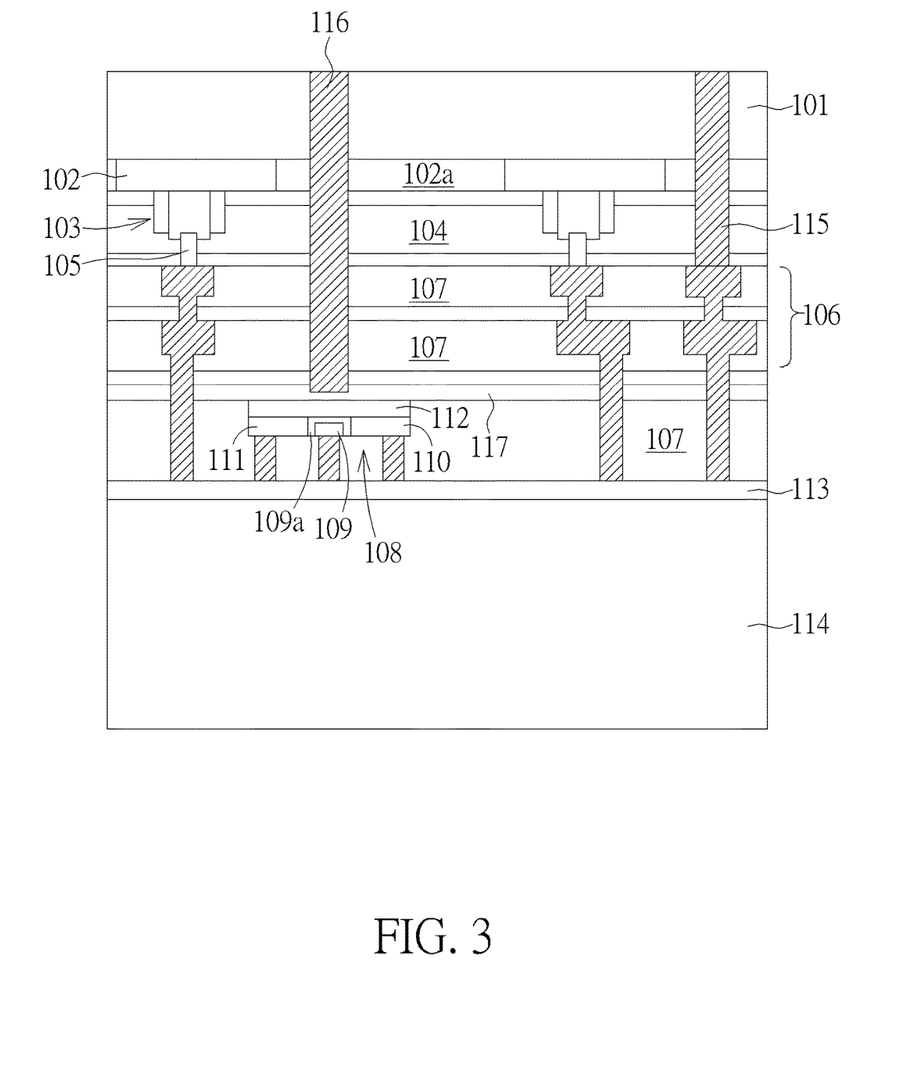

Please refer to FIG. 3. After the carrier 114 is attached, the entire wafer is turned over so that the substrate 100 would be in the position of the process surface. The substrate 100 is then completely removed by a grinding process to expose the underlying bottom oxide layer 101. After the bottom oxide layer 101 is exposed, the process of manufacturing contact plugs is performed. The process may include coating a photoresist with predetermined contact patterns on the bottom oxide layer 101, performing an anisotropic etching process with the photoresist as an etch mask to form contact holes in the ILD layer 104 and the IMD layers 107, filling up the contact holes with conductive metal, such as tungsten, to form contact plugs 115 in the contact holes, and performing a CMP process to remove the unnecessary tungsten outside the contact holes. Please note that the back gate 116 of the OSFET 108 in the present invention is in the form of contact plug. It is formed simultaneously with the contact plugs 115. The difference therebetween is that the back gate 116 is formed extending inward to the gate insulating layer 117 of the OSFET 108, while the contact plugs 115 is formed extending inward to the interconnection structures 106. The gate insulating layer 117 may function as an etch stop layer and may be slightly removed in the hole etching process. The gate insulating layer 117 is disposed between the back gate 116 and the oxide semiconductor layer 112.

In the preferred embodiment of the present invention, since the back gate 116 is formed after the formation of the oxide semiconductor layer 112, there will be no CMP process involved in this process at the OSFET 108, so that no unevenness issue will occur at the OSFET 108 and impact the performance of the OSFET 108.

Figure 4:
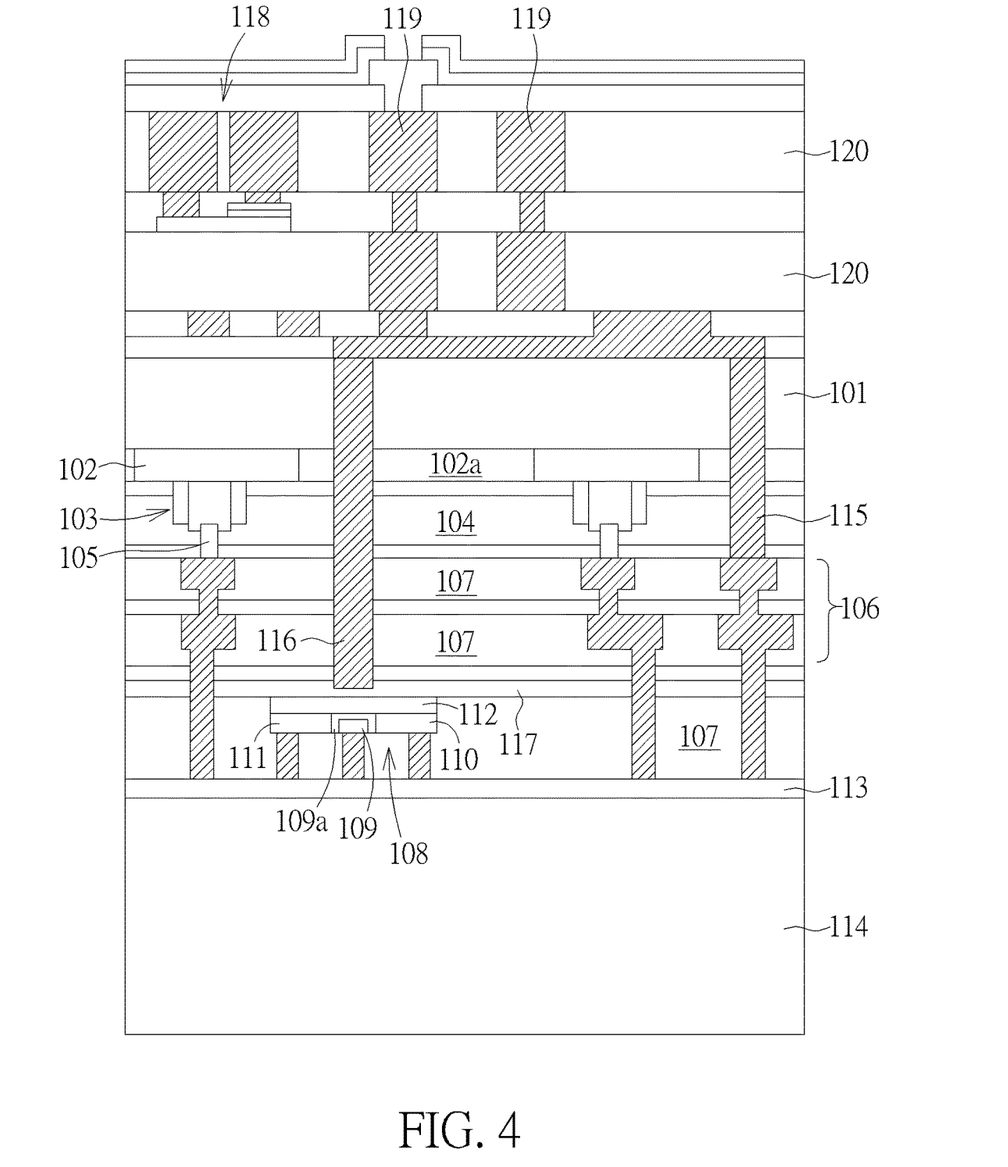

Please refer to FIG. 4. After the back gate 116 of the OSFET 108 is formed, the back side process is continuously performed to manufacture the semiconductor devices 118 and interconnection structures 119 in the IMD layers 120 on the back side of the wafer. The process of the devices 118 and interconnection structures 119 may be the same as or similar to the process of the OSFET 108 and the interconnection structures 116 on the front side of wafer. The devices 118 formed on the back side of wafer may include back side image sensor pixels, modular multilevel converters (MMC), inductors, and/or capacitors. Since the devices 118 and interconnection structures 119 on the back side of wafer are not the essential features of the present invention, relevant description is herein omitted for the clarity and simplicity of the disclosure.

FIGS. 5-8 are cross-sectional views illustrating a manufacturing process flow in accordance with the other embodiment of the present invention. The difference between the two embodiments is that this embodiment features the process on a silicon substrate, while previous embodiment features the process starting from a SOI substrate.

Figure 5:
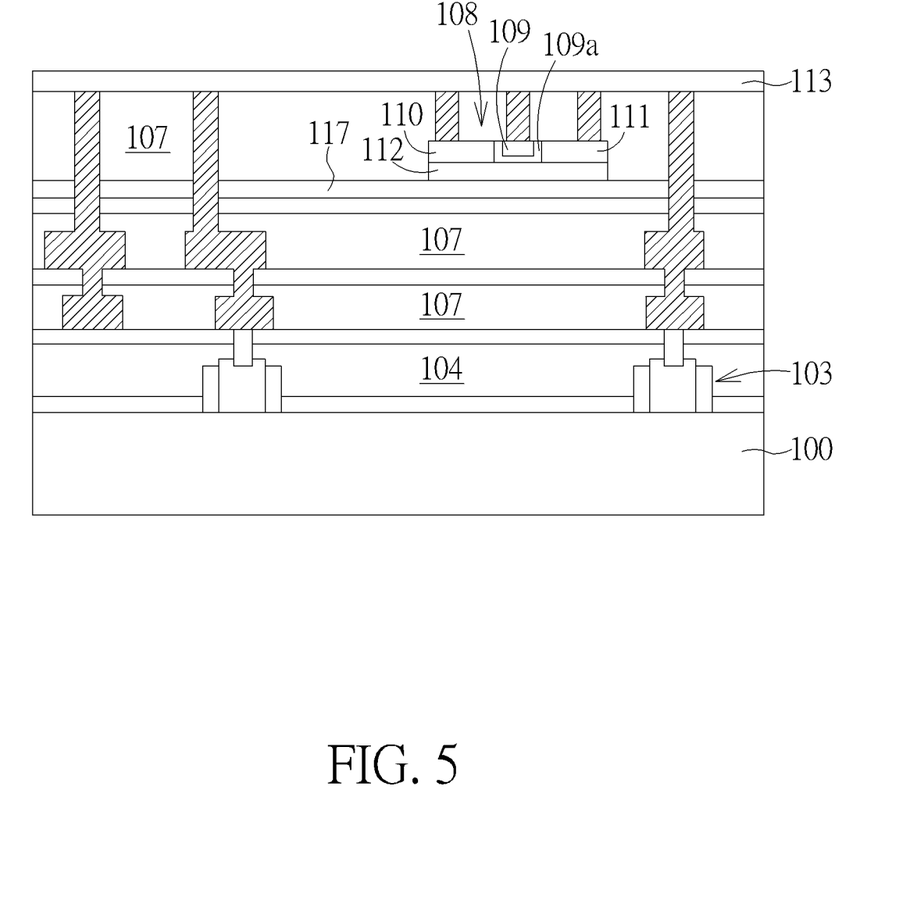
FIGS. 5-8 are cross-sectional views illustrating a manufacturing process flow in accordance with the other embodiment of the present invention.
Figure 6:
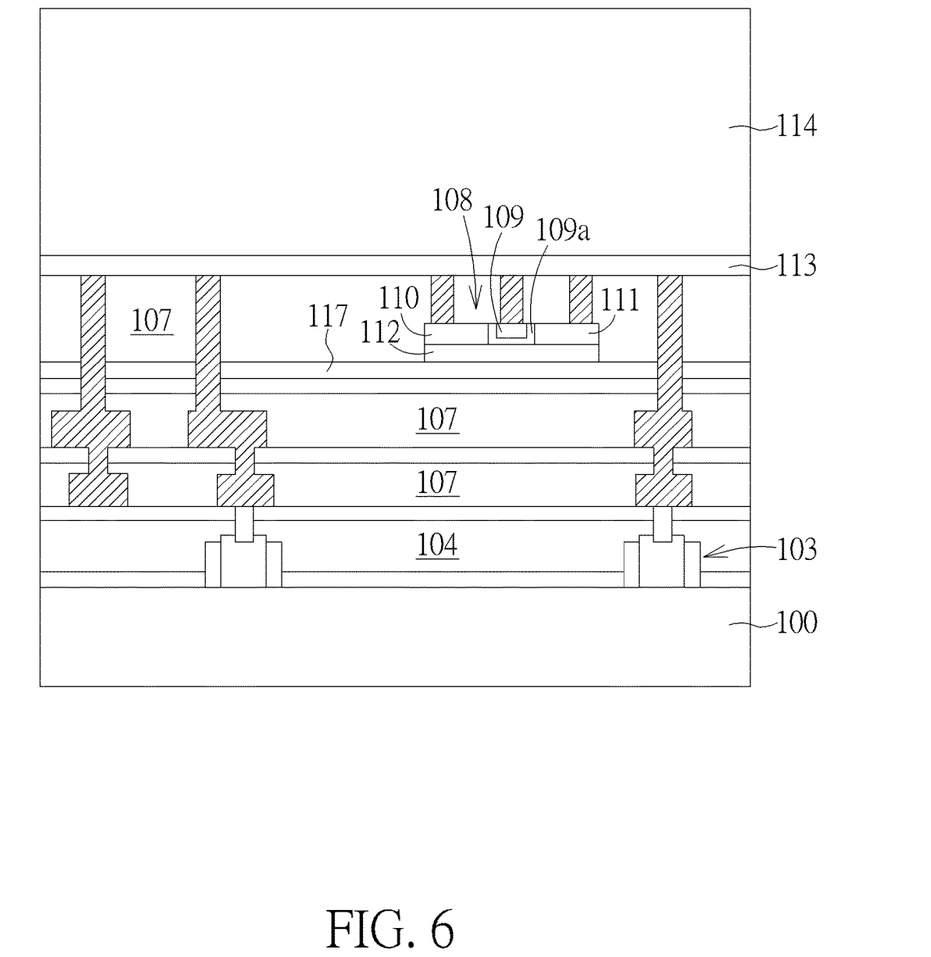

In this embodiment, as shown in FIG. 5, there is no SOI layer 102 under the poly gates 103 and no bottom oxide layer 101 between the substrate 100 and the poly gates 103. A thinner bonding layer 113 is formed on the outermost front surface of the wafer. The carrier 114 is directly attached and fused on the bonding layer 113 without any thinning process for the bonding layer 113, as shown in FIG. 6.

Figure 7:
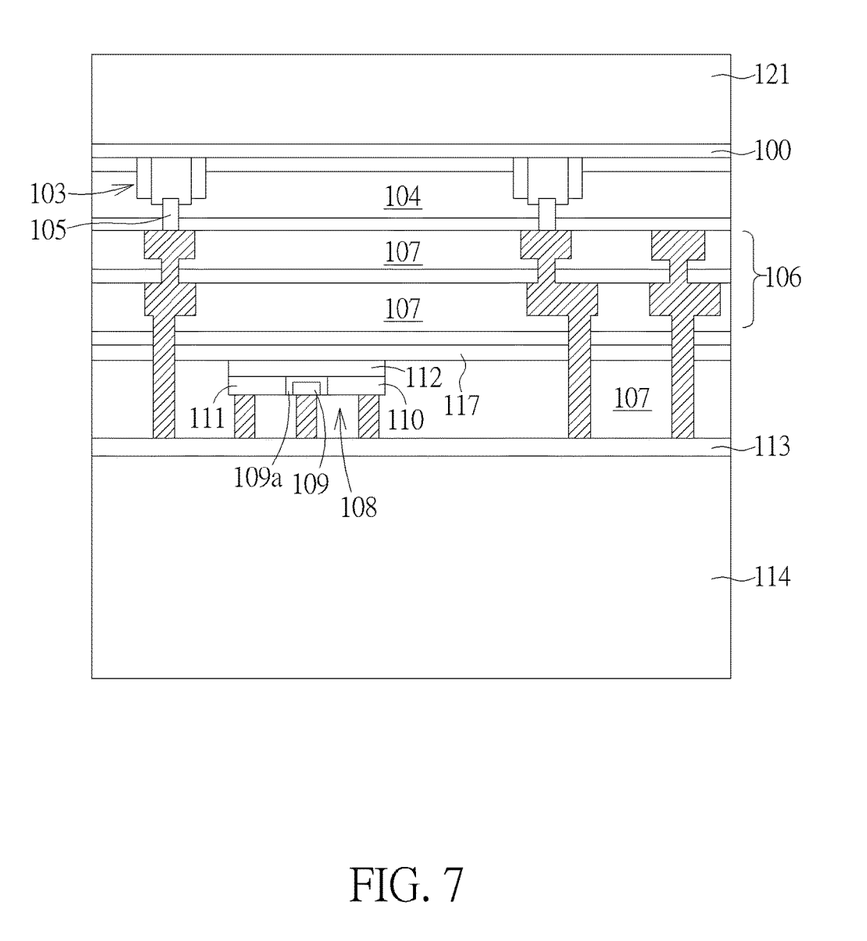
Figure 8:
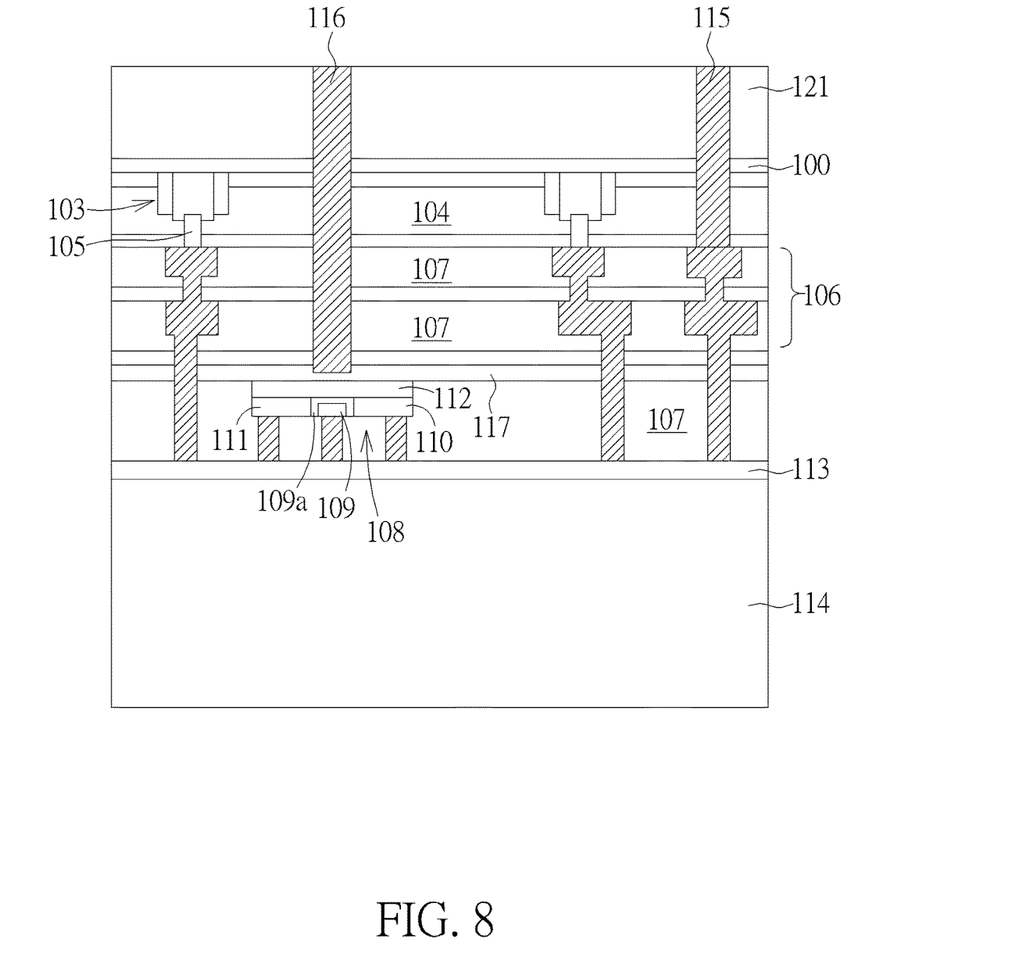

Please refer to FIG. 7. After the carrier 114 is attached, the entire wafer is turned over so that the substrate 100 would be in the position of the process surface. Unlike the first embodiment, the substrate 100 in this phase is thinned by a grinding process to a predetermined thickness, and a thick oxide layer 121 is formed thereafter on the thinned substrate 100. Please refer to FIG. 8. The subsequent process is like the one shown in FIG. 3. The process of manufacturing contact plugs is performed. The back gate 116 of the OSFET 108 in the present invention is in the form of contact plug. It is formed simultaneously with the contact plugs 115. The difference therebetween is that the back gate 116 is formed extending inward to the oxide semiconductor layer 112, while the contact plugs 115 is formed extending inward to the interconnection structures 106.

After the back gate 116 of the OSFET 108 is formed, the later processes are performed just like the one shown in FIG. 4. The devices 118 such as MMC, inductors, or capacitors and the interconnection structures 119 are formed on the back side of wafer. Repetitive and redundant description is herein omitted for the clarity and simplicity of the disclosure.

According to the process described in the embodiments above with references to FIG. 1-8, an structure of oxide semiconductor transistor is also provided in the present invention, which includes a substrate 101, a back gate 116 extending from the back side of the substrate 101, an oxide semiconductor layer 112 on the back gate 116 and the front side of the substrate 101, wherein the surface of the back gate 116 is flush with the bottom surface of the oxide semiconductor layer 112, a source 110 and a drain 111 on the oxide semiconductor layer 112, a top gate oxide layer 109a on the oxide semiconductor layer between the source 110 and the drain 111, a top gate 109 on the top gate oxide layer, and a dielectric layer 107 on the top gate 109, the source 110 and drain 111.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of manufacturing an oxide semiconductor transistor, comprising:
   providing a substrate, wherein said substrate comprises a silicon substrate;
   forming a bottom oxide layer on said silicon substrate;
   providing an oxide semiconductor transistor on a front side of said silicon substrate, wherein said oxide semiconductor transistor comprising:
      forming an oxide semiconductor layer on said silicon substrate;
      forming a source and a drain on said oxide semiconductor layer;
      forming a top gate oxide layer on said oxide semiconductor layer between said source and said drain;
      forming a top gate on said top gate oxide layer, and
      forming a dielectric layer on said top gate, said source and said drain;
   forming a bonding layer on said dielectric layer;
   attaching a wafer on said bonding layer;
   completely removing said silicon substrate by a grinding process;
   after removing said silicon substrate, forming a contact hole extending from a backside of said bottom oxide layer to said oxide semiconductor layer; and
   filling said contact hole with metal material to form a back gate of said oxide semiconductor transistor.

2. The method of manufacturing an oxide semiconductor transistor of claim 1, wherein said wafer is attached on said bonding layer by fusion bonding.

3. The method of manufacturing an oxide semiconductor transistor of claim 1, further comprising performing a polishing process to thin said bonding layer to a predetermined thickness before attaching said wafer.

4. The method of manufacturing an oxide semiconductor transistor of claim 1, further comprising a plurality of inter-metal dielectric layers and interconnection structures in said inter-metal dielectric layers between said substrate and said dielectric layer.

5. The method of manufacturing an oxide semiconductor transistor of claim 4, wherein the step of filling said contact hole with metal material simultaneously forms contact plugs extending from the backside of said substrate to said interconnection structures in said inter-metal dielectric layers.

6. An oxide semiconductor transistor, comprising:
   a substrate, wherein said substrate comprises a silicon substrate;
   a back gate extending inward from a back side of said substrate;
   an oxide semiconductor layer formed on said back gate and on a front side of said substrate;
   a source and a drain formed on said oxide semiconductor layer;
   a top gate oxide layer formed on said oxide semiconductor layer between said source and said drain;
   a top gate formed on said top gate oxide layer;
   wherein said back gate is not in contact with said oxide semiconductor layer, said top gate oxide layer and said top gate;
   a dielectric layer formed on said top gate, said source and said drain;
   a bonding layer formed on said dielectric layer;
   a plurality of inter-metal dielectric layers formed between said substrate and said dielectric layer and a plurality of interconnection structures formed in said plurality of inter-metal dielectric layers; and
   a plurality of contact plugs extending inward from the backside of said substrate to said plurality of interconnection structures in said plurality of inter-metal dielectric layers.

7. The oxide semiconductor transistor of claim 6, wherein the material of said bonding layer is tetraethoxysilane (TEOS).

8. The oxide semiconductor transistor of claim 6, further comprising a wafer attaching on said bonding layer.

9. The oxide semiconductor transistor of claim 6, further comprising a plurality of semiconductor devices, inter-metal dielectric layers and interconnection structures on the back side of said substrate.

10. The oxide semiconductor transistor of claim 6, wherein said semiconductor devices comprises image sensor pixels, modular multilevel converters, inductors, or capacitors.

11. The oxide semiconductor transistor of claim 6, further comprising an oxide layer on the back side of said substrate.

* * * * *